(12) United States Patent
Osterwald et al.

(10) Patent No.: US 10,381,283 B2
(45) Date of Patent: Aug. 13, 2019

(54) POWER SEMICONDUCTOR MODULE

(71) Applicant: Danfoss Silicon Power GmbH, Flensburg (DE)

(72) Inventors: Frank Osterwald, Kiel (DE); Ronald Eisele, Surendorf (DE); Holger Ulrich, Eisendorf (DE)

(73) Assignee: DANFOSS SILICON POWER GMBH, Flensburg (DE)

( * ) Notice: Subject to any disclaimer, the term of this patent is extended or adjusted under 35 U.S.C. 154(b) by 0 days.

(21) Appl. No.: 15/747,871

(22) PCT Filed: Jul. 4, 2016

(86) PCT No.: PCT/EP2016/065683
§ 371 (c)(1),
(2) Date: Jan. 26, 2018

(87) PCT Pub. No.: WO2017/016808
PCT Pub. Date: Feb. 2, 2017

(65) Prior Publication Data
US 2018/0218957 A1 Aug. 2, 2018

(30) Foreign Application Priority Data
Jul. 30, 2015 (DE) .......... 10 2015 112 451

(51) Int. Cl.
*H01L 23/31* (2006.01)
*H01L 23/495* (2006.01)
(Continued)

(52) U.S. Cl.
CPC ...... *H01L 23/3185* (2013.01); *H01L 23/3121* (2013.01); *H01L 23/49544* (2013.01); *H01L 24/29* (2013.01); *H01L 24/32* (2013.01); *H01L 24/33* (2013.01); *H01L 24/73* (2013.01); *H01L 23/142* (2013.01); *H01L 24/48* (2013.01); *H01L 24/72* (2013.01); *H01L 2224/29139* (2013.01);
(Continued)

(58) Field of Classification Search
CPC .................................................. H01L 23/3185
USPC ........................................................ 257/668
See application file for complete search history.

(56) References Cited

U.S. PATENT DOCUMENTS

2007/0090523 A1    4/2007  Otremba
2007/0284720 A1*  12/2007  Otremba .......... H01L 23/49524
                                                                  257/690
(Continued)

FOREIGN PATENT DOCUMENTS

DE    10 2007 041 926 A1    3/2009
DE       102013104950 B3    4/2014
EP          2 804 209 A1   11/2014

OTHER PUBLICATIONS

International Search Report for Application No. PCT/EP2016/065683 dated Sep. 22, 2016.

*Primary Examiner* — Igwe U Anya
(74) *Attorney, Agent, or Firm* — McCormick, Paulding & Huber LLP

(57) ABSTRACT

The present invention discloses a power semiconductor module, comprising: a substrate; a semiconductor provided on a top side of the substrate; and a package formed on the semiconductor and the substrate, wherein the package has openings at a top side thereof, through which terminal contacts of the semiconductor and the substrate are exposed outside and accessible from outside.

13 Claims, 1 Drawing Sheet

(51) Int. Cl.
    *H01L 23/00*     (2006.01)
    *H01L 23/14*         (2006.01)
(52) U.S. Cl.
    CPC ............ *H01L 2224/29339* (2013.01); *H01L 2224/32245* (2013.01); *H01L 2224/33181* (2013.01); *H01L 2224/48247* (2013.01); *H01L 2224/73265* (2013.01)

(56) References Cited

U.S. PATENT DOCUMENTS

| | | | |
|---|---|---|---|
| 2009/0160046 A1* | 6/2009 | Otremba | H01L 23/5389 257/700 |
| 2010/0270515 A1 | 11/2010 | Yasuda et al. | |
| 2013/0114212 A1* | 5/2013 | Tada | H01B 1/02 361/712 |
| 2014/0084433 A1* | 3/2014 | Otremba | H01L 24/37 257/676 |
| 2014/0145319 A1* | 5/2014 | Meinhold | H01L 23/492 257/676 |
| 2015/0115451 A1* | 4/2015 | Viswanathan | H01L 24/13 257/762 |
| 2015/0179556 A1 | 6/2015 | Song | |
| 2015/0357303 A1* | 12/2015 | Kohl | H01L 24/33 257/666 |

\* cited by examiner

POWER SEMICONDUCTOR MODULE

CROSS-REFERENCE TO RELATED APPLICATION

This application is a National Stage application of International Patent Application No. PCT/EP2016/065683, filed on Jul. 4, 2016, which claims priority to German Patent Application No. 10 2015 112 451.3, filed on Jul. 30, 2015, each of which is hereby incorporated by reference in its entirety.

BACKGROUND OF THE INVENTION

Field of the Invention

The present invention relates to a power semiconductor module.

Background Art

The contacting of power modules and associated printed circuit boards by means of pressure contacting is known. In the case of these modules, pressure-contact springs integrated in the module or the housing cover thereof reach down to terminal areas of a DCB (Direct Copper Bond) substrate. Direct contacting of power semiconductors is not envisaged. The contact areas are initially brought into electrical contact with the terminal areas of the DCB substrate by means of wire bonding. From there, the electrical connection is then established with respect to the printed circuit board by means of pressure-contact springs.

The pressure-contact springs are made to be of a sufficient length to be able to compensate for the tolerance due to thermal expansion between the ceramic-based substrate of the power module and the organic printed circuit board.

The arrangement described above has on the one hand an increased space requirement, since the semiconductors first have to be brought into electrical contact with a substrate terminal placed alongside the semiconductor, and the external contact is led away from there by means of pressure-contact springs.

Furthermore, the necessity of having to provide the pressure-contact spring with a long spring excursion in order to be able to compensate for the relative thermomechanical movements between the ceramic substrate of the power module and the organic printed circuit boards leads to a relatively large volume of the housing.

The power density, measured by the area requirement and the volume of the power module, is therefore relatively small and is also restricted by the fact that such DCB-based modules without baseplates generally have a restricted thermal or thermodynamic capability. In order to be able to use a sufficient heat-spreading effect, generally many small semiconductors instead of a few large semiconductors are mounted on the substrate.

SUMMARY

The present invention has been made to overcome or alleviate at least one aspect of the above disadvantages in the prior art.

According to an aspect of the present invention, there is provided a power semiconductor module, comprising: a substrate; a semiconductor provided on a top side of the substrate; and a package formed on the semiconductor and the substrate, wherein the package has openings at a top side thereof, through which terminal contacts of the semiconductor and the substrate are exposed outside and accessible from outside. This structure allows access directly to the semiconductor and the substrate without intervening conductors which may add unwanted aspects such as resistance. It will also allow not only electrical contacts but also physical pressure contacts, allowing, for example the application of force directly to the substrate or to the semiconductor. Such force is known in the field as a means of mounting such a power semiconductor module firmly to, for example, a cooled surface thereby allowing heat to be with advantage conducted away from the power semiconductor module. The ability to apply pressure directly to one surface of the semiconductor may enhance the contact between the opposite surface of the semiconductor and the cooled surface and thus directly facilitate the conduction of heat away from the semiconductor. Alternative, less direct, means of applying pressure may well suffer the disadvantage that the force is not directly normal to the interface between the semiconductor and cooled surface.

In an embodiment, the terminal contacts of the semiconductor and the substrate that are exposed outside and accessible from outside are pressure-contacted with a circuit board.

In an embodiment, the terminal contact of the semiconductor that is exposed outside and accessible from outside is provided with a bearing surface thereon.

In an embodiment, the bearing surface is copper based bearing surface, and is connected to the semiconductor by a top side connecting layer between the bearing surface and the semiconductor, the top side connecting layer is a silver sintering layer formed by silver sintering the bearing surface to the semiconductor. By silver sintering is meant a well known connection technique in the field of semiconductors whereby, for example, a paste comprising silver in the form of powder, nano powder, flakes or other forms, is applied to one or more of the surfaces to be joined. The surfaces are then brought together under certain conditions of temperature and/or pressure and a sintered layer is produced. This is known in the field to be able to form a highly reliable connection. The thickness of the copper layer can with benefit be between 20 µm and 300 µm, preferably between 35 µm and 105 µm and with even more benefit between 35 µm and 70 µm.

In an embodiment, a control terminal and a first power terminal of the semiconductor are connected to respective contact areas of the substrate.

In an embodiment, the contact area of the substrate connected to the control terminal is accessible from outside through a first opening of the openings in the package; and a terminal contact of a second power terminal of the semiconductor is accessible from outside through a second opening of the openings in the package.

In an embodiment, the control terminal and the second power terminal are provided on a top side of the semiconductor, and the first power terminal is provided on a bottom side of the semiconductor facing the substrate; and the control terminal is connected to a respective contact area of the substrate by a bonding wire, and the contact area of the substrate connected to the control terminal by the bonding wire is accessible from outside through the first opening in the package.

In an embodiment, the semiconductor is connected to the substrate by a bottom side connecting layer between the semiconductor and the substrate.

In an embodiment, the bottom side connecting layer is a silver sintering layer formed by silver sintering the semiconductor to the substrate.

In an embodiment, the second power terminal is provided on a top side of the semiconductor, the control terminal and the first power terminal are provided on a bottom side of the semiconductor facing the substrate; and the control terminal and the first power terminal are connected to respective contact areas of the substrate by a bottom side connecting layer between the semiconductor and the substrate, and the contact area of the substrate connected to the control terminal by the bottom side connecting layer is accessible from outside through the first opening in the package.

In an embodiment, the bottom side connecting layer is a silver sintering layer formed by silver sintering the semiconductor to the substrate.

In an embodiment, the power semiconductor module further comprising a base plate and an insulating film formed on a top side of the base plate, wherein the substrate is provided on a top side of the insulating film. Suitable insulating films have the characteristics of sufficiently high electrical installation, but good thermal conductivity. A number of materials are suitable, for example filled epoxy resins or materials such as polyamide.

In an embodiment, the package is made of a material that is thermomechanically adapted to that of the substrate and the base plate.

In an embodiment, the package is a molding compound molded on the substrate and the semiconductor.

In an embodiment, a contact area of the substrate at the periphery of the substrate is accessible from the periphery of the power semiconductor module.

In an embodiment, the openings in the package are arranged in such a way that they are offset from one another.

An object of the invention is to propose a module construction that makes flexible external contacting, possibly distributed over the surface area, of the module to a printed circuit board possible, and at the same time is thermomechanically adapted optimally well to the printed circuit board. This is intended to reduce both the space requirement of the module and its volume requirement, in order ultimately to save costs. An additional cost saving is intended to be made possible by choosing materials that are thermomechanically adapted to the printed circuit board.

According to an embodiment of the invention, a moulded power module is constructed on a lead frame based substrate with organic, highly heat-conductive insulating film and a metallic base plate. If the lead frame and the base plate consist of aluminium, or preferably copper, and a material that is thermomechanically adapted thereto is used as the moulding compound (e.g. an epoxy moulding compound with a high filler content), a very high degree of similarity of the thermomechanical behaviour of the power module and the printed circuit board is automatically obtained. This in turn already achieves part of the aforementioned object. No special compensating function is necessary for pressure contacting. A compression spring only has to be capable of compensating for minor thermomechanically induced tolerances, and can correspondingly be configured in a space-saving way.

In an embodiment, the contact terminal of the semiconductor may be protected by a pressure-contact bearing surface, so that a pressure contact can contact directly on the semiconductor. This provides protection for the semiconductor when it is pressure-contacted directly (for example by pressure contact springs). This makes possible a novel, resilient pressure-contact solution between a semiconductor inside a power module and a printed circuit board placed outside. The bearing surface may for example be a copper based bearing surface bonded to the contact terminals of the semiconductor by silver sintering.

The covering of the terminals, especially the power terminals of the power semiconductor, with a protective, e.g. sintered-on, metal layer, possibly surrounded by an organic carrier frame, in itself already represents a kind of housing (package) of the semiconductor. So if a number of semiconductors protected by a bearing surface are arranged on the aforementioned substrate, it is conceivable that a subsequently applied enclosure will leave the parts of the surface area of the semiconductor that are protected by the bearing surface exposed, so that as a result the semiconductor would be at the mercy of unfavourable ambient influences.

When embodied in practice, it may be that the control terminals of circuit breakers in particular are quite small in area. Instead of also exposing these small-area semiconductor terminals, in order subsequently to bring them into electrical contact directly with the printed circuit board, it may be advantageous to adopt the usual practice and bring them into electrical contact with the substrate by means of wirebonding contacts and lead the terminals from the substrate to the outside. For this purpose, a corresponding surface element of the substrate would be left free of moulding compound. Alternatively, it is conceivable to lead terminals of the substrate to the outside. It is possible for these terminals to be designed in any way desired (that is to say also able to be pressure-contacted).

In an embodiment, the contacting of control terminals can be achieved in a way if the contacting of semiconductor switches takes place invertedly, that is to say with the first main side, comprising the control, auxiliary and power terminals, directed downwards towards the substrate. Since in this case no wire bonding loops protrude beyond the level of the power semiconductors, a very flat package can be created.

In a configurational variant of the shaping of the moulding, particular attention is paid to the dimensional stability of the relatively thin housing. Since the openings for the contacting of the semiconductor terminals and the substrate terminals are clearances in the moulding compound, importance is attached to an arrangement of the openings that does not lead to a "predetermined breaking line" of the power module. This may be obtained in particular by a chequerboard-like offsetting of the terminal clearances in the power module, which is achieved by corresponding prior arrangement of the semiconductors. The arrangement of the openings for the semiconductor contacts preferably should not be arranged in a way, that weak lines in the housing are resulting. This would be the case, if all openings are placed on a line. The openings might be better placed such that they do not form single lines in order to avoid weakening of the housing.

Apart from pressure contacting with respect to the printed circuit board, the construction described is also suitable for embedding of power components in a printed circuit board. In this case, such a package may be inserted directly into a clearance of the prepreg of the printed circuit board. The connection with respect to the terminals may take place by corresponding plating steps. The ideal preconditions for printed circuit board embedding are based in particular on the grounds that an outstanding adaptation of the material to the materials of the printed circuit boards is ensured. Such a power module can be tested before the embedding, and consequently a high yield in the mounting of subassemblies could be ensured.

Among the processes that come into consideration for the production of such moulded housings is the so-called transfer moulding process, in which the moulding compound is introduced into a mould enclosing the semi finished product under a relatively high pressure. If, at the points that are not to be filled with moulding compound, this mould has mould parts that are temperature-resistant, relatively soft and adapted in terms of the thermal expansion behaviour, very low-cost and simple production of such modules can be ensured.

In some embodiments, other types of material (as alternative to mould compound), for example epoxy-type potting and/or encapsulating material, may be used for conformal coating of the power module and may result in a mechanically robust outline.

The substrate in this invention may be of various types, for example DCB (Direct Copper Bond), IMS (Insulated Metal Substrate), or lead frame based substrate, etc.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION

Figure 1:
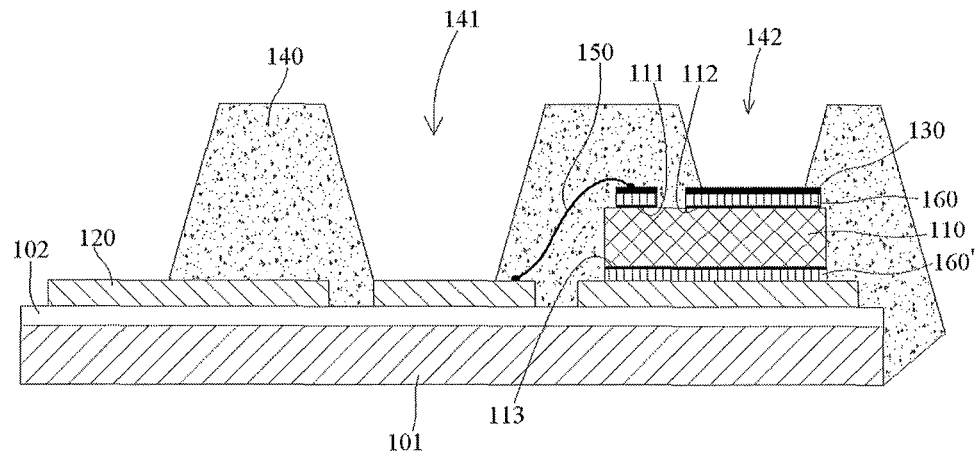
FIG. 1 is an illustrative cross section view of a power semiconductor module according to a first exemplary embodiment of the present invention.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to a general concept of the present invention, there is provided a power semiconductor module, comprising: a substrate; a semiconductor provided on a top side of the substrate; and a package formed on the semiconductor and the substrate, wherein the package has openings at a top side thereof, through which terminal contacts of the semiconductor and the substrate are exposed outside and accessible from outside.

First Embodiment

FIG. 1 is an illustrative cross section view of a power semiconductor module according to a first exemplary embodiment of the present invention.

In an embodiment of the present invention, a power semiconductor module is disclosed. As shown in FIG. 1, the power semiconductor module mainly comprises a substrate 120, a semiconductor 110 and a package 140.

As shown in FIG. 1, the semiconductor 110 is provided on a top side of the substrate 120. The package 140 is formed on the semiconductor 110 and the substrate 120. As shown in FIG. 1, the package 140 has openings 141, 142 formed therein at a top side thereof, through which terminal contacts of the semiconductor 110 and the substrate 120 are exposed outside and accessible from outside. The terminal contacts of the semiconductor 110 and the substrate 120 that are exposed outside and accessible from outside may be pressure-contacted with a printed circuit board by, for example, pressure-contact springs.

In an exemplary embodiment of the present invention, as shown in FIG. 1, the substrate 120 is a lead frame based substrate; and a control terminal 111 (for example Gate or Base) and a first power terminal 113 of the semiconductor 110 are connected to respective contact areas of the substrate 120.

In the illustrated embodiment shown in FIG. 1, a contact area, served as a terminal contact, of the substrate 120 connected to the control terminal 111 is accessible from outside through a first opening 141 of the openings in the package 140. A terminal contact of a second power terminal 112 of the semiconductor 110 is accessible from outside through a second opening 142 of the openings in the package 140. The terminal contact of the second power terminal 112 may be pressure-contacted with a printed circuit board by, for example, pressure-contact spring (not shown).

As shown in FIG. 1, in this exemplary embodiment, the control terminal 111 and second power terminal 112 both are provided on a top side of the semiconductor 110, and the first power terminal 113 is provided on a bottom side of the semiconductor 110 facing the substrate 220. The control terminal 111 is connected to a respective contact area of the substrate 120 by a bonding wire 150, and the contact area, served as the terminal contact, of the substrate 120 connected to the control terminal 111 by the bonding wire 150 is accessible from outside through the first opening 141 in the package 140. This contact area may be pressure-contacted with a printed circuit board by, for example, pressure-contact spring (not shown).

As shown in FIG. 1, in an embodiment, the control terminal 111 and the second power terminal 112 are provided with a copper based bearing surface 130 thereon, and the bearing surface 130 is connected to the semiconductor 110 by a top side connecting layer 160 between the bearing surface 130 and the semiconductor 110. In this case, the bearing surface 130 on the second power terminal 112 is served as the terminal contact and a protection layer of the second power terminal 112 and is accessible from outside through the second opening 142 in the package 140, for example may be pressure-contacted with a printed circuit board by, for example, pressure-contact spring (not shown).

In an exemplary embodiment, as shown in FIG. 1, the top side connecting layer 160 may be a silver sintering layer formed by silver sintering the bearing surface 130 to the semiconductor 110.

In an exemplary embodiment, as shown in FIG. 1, the semiconductor 110 may be connected to the substrate 120 by a bottom side connecting layer 160' between the semiconductor 110 and the substrate 120.

In an exemplary embodiment, as shown in FIG. 1, the bottom side connecting layer 160' may be a silver sintering layer formed by silver sintering the semiconductor 110 to the substrate 120.

In an exemplary embodiment, as shown in FIG. 1, the power semiconductor module may further comprise a base plate 101 and an insulating film 102 formed on a top side of the base plate 101. As shown in FIG. 1, the substrate 120 is provided on a top side of the insulating film 102.

In an exemplary embodiment, as shown in FIG. 1, the package 140 is made of a material that is thermomechanically adapted to that of the substrate 120 and the base plate 101.

In an exemplary embodiment, as shown in FIG. 1, the package 140 may be a molding compound molded on the substrate 120 and the semiconductor 110.

In an exemplary embodiment, as shown in FIG. 1, a contact area of the substrate 120 at the periphery of the substrate 120 may be accessible from the periphery of the power semiconductor module. For example, as shown in FIG. 1, on the left-hand side of the moulding compound 140, by way of example, a further potential surface of the substrate 120 is accessible from the periphery. This is intended to illustrate a further design possibility.

In an exemplary embodiment, as shown in FIG. 1, the openings 141, 142 in the package 140 are arranged in such a way that they are offset from one another. In this way, an arrangement of the openings that does not lead to a "predetermined breaking line" of the power module is provided. This can be obtained in particular by a chequerboard-like offsetting of the terminal clearances in the power module, which is achieved by corresponding prior arrangement of the semiconductors. The arrangement of the openings for the semiconductor contacts preferably should not be arranged in a way, that weak lines in the housing are resulting. This would be the case, if all openings are placed on a line. The openings might be better placed such that they do not form single lines in order to avoid weakening of the housing.

Second Embodiment

Figure 2:
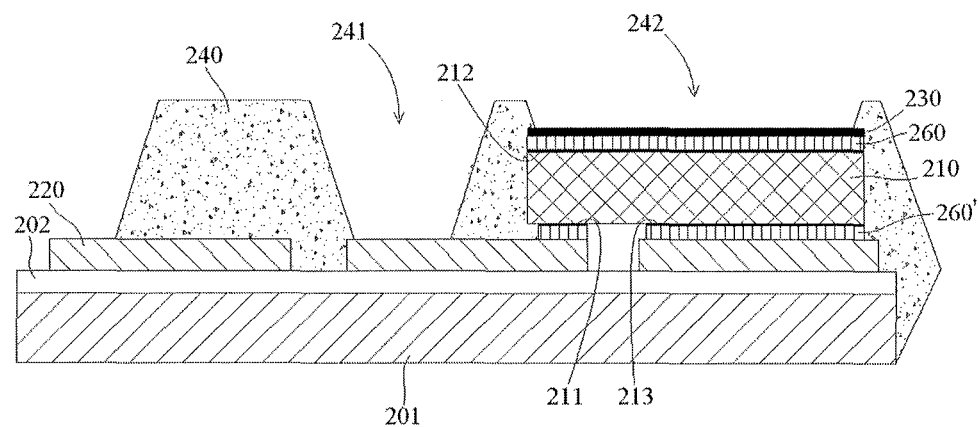
FIG. 2 is an illustrative cross section view of a power semiconductor module according to a second exemplary embodiment of the present invention.

FIG. 2 is an illustrative cross section view of a power semiconductor module according to a second exemplary embodiment of the present invention.

In an embodiment of the present invention, a power semiconductor module is disclosed. As shown in FIG. 2, the power semiconductor module mainly comprises a substrate 220, a semiconductor 210 and a package 240.

As shown in FIG. 2, the semiconductor 210 is provided on a top side of the substrate 220. The package 240 is formed on the semiconductor 210 and the substrate 220. As shown in FIG. 2, the package 240 has openings 241, 242 formed therein at a top side thereof, through which terminal contacts of the semiconductor 210 and the substrate 220 are exposed outside and accessible from outside. The terminal contacts of the semiconductor 210 and the substrate 220 that are exposed outside and accessible from outside may be pressure-contacted with a printed circuit board by, for example, pressure-contact springs.

In an exemplary embodiment of the present invention, as shown in FIG. 2, the substrate 220 is a lead frame based substrate; and a control terminal 211 (for example Gate or Basis) and a first power terminal 213 of the semiconductor 210 are connected to respective contact areas of the substrate 220.

In the illustrated embodiment shown in FIG. 2, a contact area, served as a terminal contact, of the substrate 220 connected to the control terminal 211 is accessible from outside through a first opening 241 of the openings in the package 240. A terminal contact of a second power terminal 212 of the semiconductor 210 is accessible from outside through a second opening 242 of the openings in the package 240. The terminal contact of the second power terminal 212 may be pressure-contacted with a printed circuit board by, for example, pressure-contact spring.

As shown in FIG. 2, in this exemplary embodiment, the second power terminal 212 is provided on a top side of the semiconductor 210, and the control terminal 211 and the first power terminal 213 are provided on a bottom side of the semiconductor 210 facing the substrate 220. The control terminal 211 and the first power terminal 213 are connected to respective contact areas of the substrate 220 by a bottom side connecting layer 260' between the semiconductor 210 and the substrate 220, and the contact area of the substrate 220 connected to the control terminal 211 by the bottom side connecting layer 260' is accessible from outside through the first opening 241 in the package 240. This contact area may be pressure-contacted with a printed circuit board by, for example, pressure-contact spring.

In an exemplary embodiment, as shown in FIG. 2, the bottom side connecting layer 260' may be a silver sintering layer formed by silver sintering the semiconductor 210 to the substrate 220.

As shown in FIG. 2, in an embodiment, the second power terminal 212 is provided with a copper based bearing surface 230 thereon, and the bearing surface 230 is connected to the semiconductor 210 by a top side connecting layer 260 between the bearing surface 230 and the semiconductor 210. In this case, the bearing surface 230 on the second power terminal 212 is served as the terminal contact and a protection layer of the second power terminal 212 and is accessible from outside through the second opening 242 in the package 240, for example may be pressure-contacted with a printed circuit board by, for example, pressure-contact spring.

In an exemplary embodiment, as shown in FIG. 2, the top side connecting layer 260 may be a silver sintering layer formed by silver sintering the bearing surface 230 to the semiconductor 210.

In an exemplary embodiment, as shown in FIG. 2, the power semiconductor module may further comprise a base plate 201 and an insulating film 202 formed on a top side of the base plate 201. As shown in FIG. 2, the substrate 220 is provided on a top side of the insulating film 202.

In an exemplary embodiment, as shown in FIG. 2, the package 240 is made of a material that is thermomechanically adapted to that of the substrate 220 and the base plate 201.

In an exemplary embodiment, as shown in FIG. 2, the package 240 may be a molding compound molded on the substrate 220 and the semiconductor 210.

In an exemplary embodiment, as shown in FIG. 2, a contact area of the substrate 220 at the periphery of the substrate 220 may be accessible from the periphery of the power semiconductor module. For example, as shown in FIG. 2, on the left-hand side of the moulding compound 240, by way of example, a further potential surface of the substrate 220 is accessible from the periphery. This is intended to illustrate a further design possibility.

In an exemplary embodiment, as shown in FIG. 2, the openings 241, 242 in the package 240 are arranged in such a way that they are offset from one another. In this way, an arrangement of the openings that does not lead to a "predetermined breaking line" of the power module is provided. This can be obtained in particular by a chequerboard-like offsetting of the terminal clearances in the power module, which is achieved by corresponding prior arrangement of the semiconductors. The arrangement of the openings for the semiconductor contacts preferably should not be arranged in a way, that weak lines in the housing are resulting. This would be the case, if all openings are placed on a line. The openings might be better placed such that they do not form single lines in order to avoid weakening of the housing.

In the exemplary embodiment shown in FIG. 2, it is intended to illustrate a further design possibility. The flip-chip arrangement of the power semiconductor in this configurational variant makes it possible to dispense with wire bonds, so that the housing can be very flat. In an ideal case, directly above the power semiconductor it may finish flush with the protected contact area thereof.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A power semiconductor module, comprising:
a substrate;
a semiconductor provided on a top side of the substrate; and
a package formed on the semiconductor and the substrate,
wherein the package has openings at a top side thereof, through which terminal contacts of the semiconductor and the substrate are exposed outside and accessible from outside;
wherein a control terminal and a first power terminal of the semiconductor are connected to respective contact areas of the substrate,
wherein the contact area of the substrate connected to the control terminal is accessible from outside through a first opening of the openings in the package,
wherein a terminal contact of a second power terminal of the semiconductor is accessible from outside through a second opening of the openings in the package,
wherein the second power terminal is provided on a top side of the semiconductor, the control terminal and the first power terminal are provided on a bottom side of the semiconductor facing the substrate; and
wherein the control terminal and the first power terminal are connected to respective contact areas of the substrate by a bottom side connecting layer between the semiconductor and the substrate, and the contact area of the substrate connected to the control terminal by the bottom side connecting layer is accessible from outside through the first opening in the package.

2. The power semiconductor module according to claim 1, wherein the terminal contacts of the semiconductor and the substrate that are exposed outside and accessible from outside are pressure-contacted with a circuit board.

3. The power semiconductor module according to claim 2, wherein the terminal contact of the semiconductor that is exposed outside and accessible from outside is provided with a bearing surface thereon.

4. The power semiconductor module according to claim 2, further comprising:
a base plate; and
an insulating film formed on a top side of the base plate, wherein the substrate is provided on a top side of the insulating film.

5. The power semiconductor module according to claim 1, wherein the terminal contact of the semiconductor that is exposed outside and accessible from outside is provided with a bearing surface thereon.

6. The power semiconductor module according to claim 1, further comprising:
a base plate; and
an insulating film formed on a top side of the base plate, wherein the substrate is provided on a top side of the insulating film.

7. The power semiconductor module according to claim 6, wherein the package is made of a material that is thermomechanically adapted to that of the substrate and the base plate.

8. The power semiconductor module according to claim 1, wherein the package is a molding compound molded on the substrate and the semiconductor.

9. The power semiconductor module according to claim 1, wherein a contact area of the substrate at the periphery of the substrate is accessible from the periphery of the power semiconductor module.

10. The power semiconductor module according to claim 1, wherein the openings in the package are arranged in such a way that they are offset from one another.

11. The power semiconductor module according to claim 5, further comprising:
a base plate; and
an insulating film formed on a top side of the base plate, wherein the substrate is provided on a top side of the insulating film.

12. The power semiconductor module according to claim 5, wherein the bearing surface is copper based bearing surface, and is connected to the semiconductor by a top side connecting layer between the bearing surface and the semiconductor, wherein the top side connecting layer is a silver sintering layer formed by silver sintering the bearing surface to the semiconductor.

13. The power semiconductor module according to claim 12, further comprising:
a base plate; and
an insulating film formed on a top side of the base plate, wherein the substrate is provided on a top side of the insulating film.

* * * * *